US012603644B2

(12) United States Patent
Chatterjee et al.

(10) Patent No.: US 12,603,644 B2
(45) Date of Patent: Apr. 14, 2026

(54) METHODS AND APPARATUS TO DETERMINE A FREQUENCY OF A SIGNAL

(71) Applicant: Texas Instruments Incorporated, Dallas, TX (US)

(72) Inventors: Rohit Chatterjee, Bangalore (IN); Atul Ramakant Lele, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 58 days.

(21) Appl. No.: 18/525,334

(22) Filed: Nov. 30, 2023

(65) Prior Publication Data

US 2025/0183883 A1      Jun. 5, 2025

(51) Int. Cl.
| *H03K 5/24* | (2006.01) |
| *G06F 1/08* | (2006.01) |
| *H03K 21/02* | (2006.01) |

(52) U.S. Cl.
CPC ................. *H03K 5/24* (2013.01); *G06F 1/08* (2013.01); *H03K 21/02* (2013.01)

(58) Field of Classification Search
None
See application file for complete search history.

(56) References Cited

U.S. PATENT DOCUMENTS

| 5,986,485 A | 11/1999 | O'Sullivan |
| 12,241,920 B2 * | 3/2025 | Alagappan ............. G01R 23/02 |
| 2014/0210563 A1 | 7/2014 | Akaike et al. |
| 2019/0004563 A1 | 1/2019 | Nelson et al. |
| 2023/0034239 A1 | 2/2023 | Toriumi |

FOREIGN PATENT DOCUMENTS

| CN | 105790757 A | 7/2016 |

OTHER PUBLICATIONS

International PCT Search Report for PCT/US2023/086300 dated Aug. 23, 2024.

* cited by examiner

*Primary Examiner* — Cassandra F Cox
(74) *Attorney, Agent, or Firm* — Michelle F. Murray; Frank D. Cimino

(57) ABSTRACT

An example apparatus includes: comparison circuitry configured to determine first and second frequencies from a plurality of clock count ranges and a clock count value, the plurality of clock count ranges each having a range of possible count values corresponding to possible frequencies, the first and second frequencies correspond to the clock count ranges that include the clock count value; comparator circuitry configured to generate a temperature indication based on a comparison of a temperature voltage to a reference temperature voltage; and overlap determination circuitry configured to select one of the first or second frequencies based on the comparator circuitry.

19 Claims, 7 Drawing Sheets

METHODS AND APPARATUS TO DETERMINE A FREQUENCY OF A SIGNAL

TECHNICAL FIELD

This description relates generally to frequency detection and, more particularly, to methods and apparatus to determine a frequency of a signal.

BACKGROUND

With continuing advancements in electronic design, clock generation circuitry has become capable of generating clock signals at increasing speeds and precision. Crystal oscillator circuitry utilizes a crystal component to generate an oscillator signal having a characteristic frequency. The crystal component is often external to circuitry of a device to increase accuracy and precision by decreasing electro-magnetic interference (EMI). Some devices generate clock signals using an oscillator signal from external circuitry, such as external crystal component (XTAL), to reliably perform increasingly complex operations.

SUMMARY

For methods and apparatus to determine a frequency of a signal, an example apparatus includes comparison circuitry configured to determine first and second frequencies from a plurality of clock count ranges and a clock count value, the plurality of clock count ranges each having a range of possible count values corresponding to possible frequencies, the first and second frequencies correspond to the clock count ranges that include the clock count value; comparator circuitry configured to generate a temperature indication based on a comparison of a temperature voltage to a reference voltage; and overlap determination circuitry configured to select one of the first or second frequencies based on the comparator circuitry.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
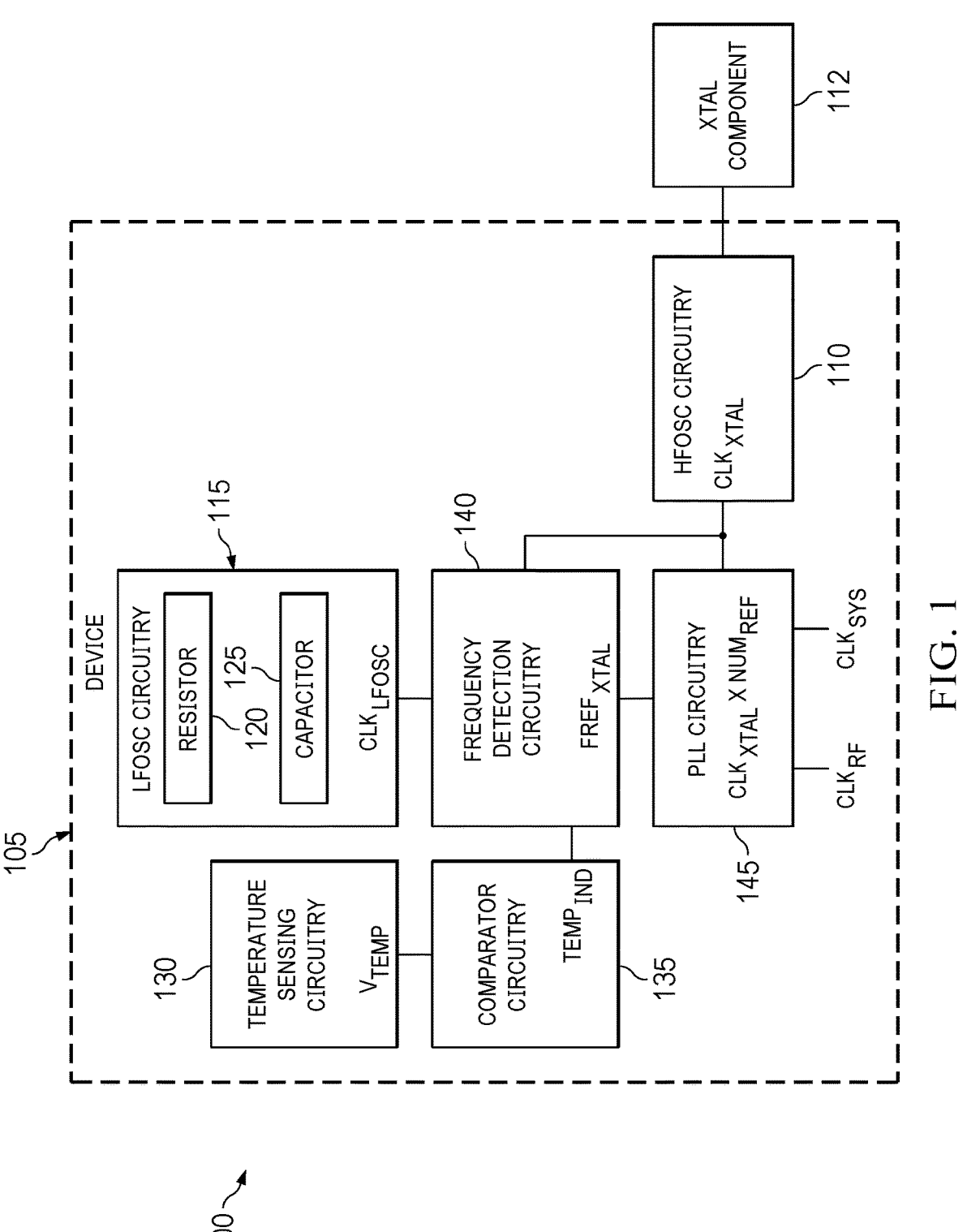
FIG. 1 is a block diagram of an example device that receives a clock signal from oscillator circuitry having an external crystal component, the device including example comparator circuitry and example frequency detection circuitry which determines a frequency of the clock signal.

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/or irregular.

With continuing advancements in electronic design, clock generation circuitry has become capable of generating clock signals at increasing speeds and precision. Crystal oscillator circuitry utilizes a crystal component to generate an oscillator signal having a characteristic frequency. The crystal component is often external to circuitry of a device to increase accuracy and precision by decreasing electro-magnetic interference (EMI). Some devices use clock signals generated from oscillator signals from external circuitry, such as external crystal component (XTAL), to reliably perform increasingly complex operations.

Some devices, such as devices which utilize a wireless local area network (WLAN) connection call for a stable fixed frequency (FREF) clock signal with minimal phase noise. Circuits rely on an oscillator signal from XTAL oscillator circuitry to accurately and precisely generate such clock signals. The characteristic frequency of the oscillator signal from the XTAL oscillator circuitry is determined by a resonant frequency of the crystal component. Accordingly, modifying the XTAL component of XTAL oscillator circuitry modifies the frequency of a clock signal. For example, XTAL oscillator circuitry may generate a clock signal having a frequency approximately equal to one of twenty-six megahertz (26 MHz), forty megahertz (40 MHz), forty-eight megahertz (48 MHz), fifty-two megahertz (52 MHz), etc.

Because a given XTAL oscillator circuit may provide one of a range of possible frequencies, some devices use a predetermined value as the frequency of the clock signal. Such devices may generate one or more relatively low-speed clock signals using the relatively high-speed oscillator clock signal generated based on the oscillator signal from the XTAL oscillator circuitry. To reliably generate the one or more relatively low-speed clock signals, the device divides the oscillator clock signal by a reference number which is determined based on the characteristic frequency of the oscillator clock signal. However, because the XTAL component is external to some circuitry of the device, the characteristic frequency of the oscillator signal may not be known and/or correctly identified by the predetermined value.

Examples described herein include example methods and apparatus to determine a frequency of a signal. In some described examples, frequency detection circuitry determines the frequency of a first relatively high-speed oscillator signal based on a second relatively low-speed oscillator signal and a temperature. In some such examples, the frequency detection circuitry determines a clock count value by counting a number of cycles of the first oscillator clock signal across one or more cycles of the second oscillator clock signal. The frequency detection circuitry compares the clock count value to a plurality of clock count ranges to determine possible frequencies of the first oscillator clock signal. In some examples, the frequency detection circuitry determines a plurality of clock count ranges that include the determined clock count value. In such examples, the frequency detection circuitry uses a temperature indication from comparator circuitry to select a frequency of one of the plurality of clock count ranges. The comparator circuitry generates the temperature indication based on a comparison of a temperature voltage to a reference voltage. The frequency detection circuitry determines the frequency of the first oscillator clock signal responsive to the clock count value and the temperature indication.

FIG. 1 is a block diagram of an example system 100. In the example of FIG. 1, the system 100 includes an example device 105, example high frequency oscillator (HFOSC) circuitry 110, an example external crystal (XTAL) component 112, example low frequency oscillator (LFOSC) circuitry 115, an example resistor 120, an example capacitor 125, example temperature sensing circuitry 130, example comparator circuitry 135, example frequency detection circuitry 140, and example phase locked loop (PLL) circuitry 145. The system 100 is formed responsive to coupling the HFOSC circuitry 110 to the device 105. In some examples, components of the system 100 may be included in a single package.

The device 105 may be coupled to the external XTAL component 112. The device 105 uses an oscillator signal of the external XTAL component 112 to generate a relatively high-speed first oscillator clock signal ($CLK_{XTAL}$). In the example of FIG. 1, the device 105 includes the HFOSC circuitry 110, the LFOSC circuitry 115, the resistor 120, the capacitor 125, the temperature sensing circuitry 130, the comparator circuitry 135, the frequency detection circuitry 140, and the PLL circuitry 145. The device 105 determines possible frequencies of the first oscillator clock signal using a relatively low-speed second oscillator clock signal ($CLK_{LFOSC}$). In some examples, the device 105 determines the frequency of the first oscillator clock signal to be one of the possible frequencies based on a temperature of the system 100. Alternatively, the device 105 may be modified, in accordance with this description, to include one or more additional components. For example, the device 105 may supply a reference clock signal ($CLK_{RF}$) and/or a system clock signal ($CLK_{SYS}$) to one or more additional components (not illustrated for simplicity).

The HFOSC circuitry 110 is coupled to the frequency detection circuitry 140, the PLL circuitry 145, and may be coupled to the external XTAL component 112. The HFOSC circuitry 110 generates the first oscillator clock signal with a fixed frequency (FREF). In some examples, the HFOSC circuitry 110 uses a crystal component as timing element of an oscillator. In such examples, physical characteristics of the external XTAL component 112 determine the frequency of the first oscillator clock signal. For example, the frequency of the first oscillator clock signal is based on the resonant frequency of the external XTAL component 112. Advantageously, the HFOSC circuitry 110 accurately and reliably generates the first oscillator clock signal. The HFOSC circuitry 110 supplies the first oscillator clock signal to the frequency detection circuitry 140 and the PLL circuitry 145.

The LFOSC circuitry 115 is coupled to the frequency detection circuitry 140. In the example of FIG. 1, the LFOSC circuitry 115 includes the resistor 120 and the capacitor 125. The LFOSC circuitry 115 generates the relatively low-speed second oscillator clock signal using the resistor 120 and the capacitor 125. The second oscillator clock signal has a frequency that is less than the frequency of the first oscillator clock signal of the HFOSC circuitry 110. In the example of FIG. 1, the LFOSC circuitry 115 supplies the second oscillator clock signal to the frequency detection circuitry 140. In some examples, the LFOSC circuitry 115 may supply the second oscillator clock signal to one or more additional components of the device 105. For example, the LFOSC circuitry 115 may supply the second oscillator clock signal to the PLL circuitry 145.

The resistor 120 is to be coupled to the capacitor 125. In some examples, the resistor 120 has a resistance, which is temperature dependent. For example, when the resistor 120 is an NWELL resistor, the resistance of the resistor 120 increases and/or decreases responsive to changes in the temperature of the device 105. The capacitor 125 has a capacitance. The resistor 120 and the capacitor 125 form a resistor-capacitor oscillator that generates the second oscillator clock signal. The resistance of the resistor 120 and the capacitance of the capacitor 125 determine a frequency of the second oscillator clock signal. For example, the resistance of the resistor 120 and the capacitance of the capacitor 125 may be empirically determined to generate a thirty-two kilohertz (32 kHz) clock signal as the second oscillator clock signal. In the example of FIG. 1, variations in the resistance of the resistor 120 across temperatures of the device 105 vary the frequency of second oscillator clock signal.

However, the frequency of the second oscillator clock signal may not be guaranteed. In some examples, the variations in the resistance of the resistor 120 may vary the frequency of the second oscillator clock signal. For example, the resistance of the resistor 120 may vary by plus or minus eleven percent across a range of operating temperatures. In another similar example, the resistance of the resistor 120 may vary from minus seventeen percent to plus five percent across a range of operating temperatures. In both examples, the variations in the resistance of the resistor 120 vary the frequency of the second oscillator clock signal across the range of operating temperatures. Although in the example of FIG. 1, one or more ranges of variations in the resistor 120 are described, any range of variations in the resistor 120 vary the frequency of the second oscillator clock signal. In some examples, the resistor 120 may be replaced with a zero-temperature coefficient (ZTC) resistor, which has a resistance that is temperature independent. However, replacing the resistor 120 with a ZTC resistor may add an additional mask to the manufacturing process which may increase cost, complexity, production time, etc.

The temperature sensing circuitry 130 is coupled to the comparator circuitry 135. The temperature sensing circuitry 130 generates a temperature voltage ($V_{TEMP}$) as a temperature dependent voltage. The temperature sensing circuitry 130 modifies the temperature voltage responsive to a temperature of the device 105. In some examples, the temperature sensing circuitry 130 increases the temperature voltage as the temperature of the device 105 decreases. In such examples, the temperature sensing circuitry decreases the temperature voltage as the temperature of the device 105 increases. The temperature sensing circuitry 130 may monitor the temperature of one or more components of the device 105. In some examples, the temperature sensing circuitry 130 may monitor the temperature of silicon surrounding components of the device 105. For example, the temperature sensing circuitry 130 may be a thermal bipolar junction transistor (BJT) configured to monitor the temperature of the silicon near a power amplifier. In such examples, the temperature sensing circuitry 130 may be electrically and/or mechanically coupled to one or more alternative components of the device 105, that are not illustrated in FIG. 1. For example, a temperature circuitry coupled to the temperature sensing circuitry 130 modifies the temperature dependent characteristics of the BJT to generate a temperature dependent voltage.

Advantageously, during startup operations of the device 105, the temperature sensing circuitry 130 senses an ambient temperature of the device 105 responsive to operations of the one or more alternative components occurring for a brief period (e.g., since startup). The temperature sensing circuitry 130 supplies the temperature voltage to the comparator circuitry 135. Advantageously, the temperature sensing circuitry 130 generates the temperature voltage which represents a temperature of a component of the system 100. Advantageously, the temperature sensing circuitry 130 is needed for a brief period during start-up to determine the frequency of the first oscillator clock signal. Advantageously, the temperature sensing circuitry 130 may be already included in existing designs to monitor the temperature of a component. Advantageously, using an existing implementation of the temperature sensing circuitry 130 decreases the additional cost of implementing the frequency detection circuitry 140.

Figure 2:
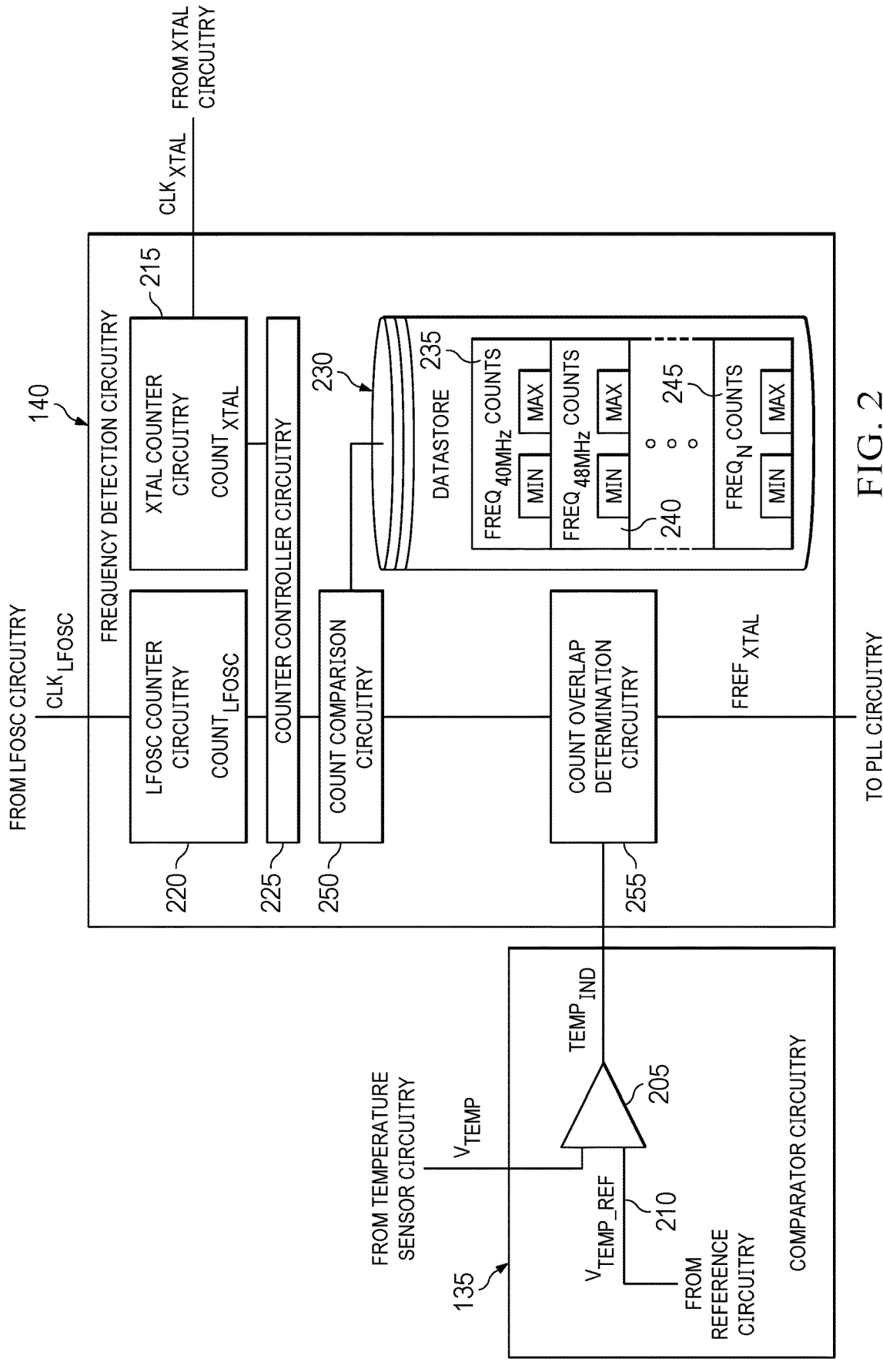
FIG. 2 is a schematic diagram of an example of the comparator circuitry of FIG. 1 and an example of the frequency detection circuitry of FIG. 1.

The comparator circuitry 135 is coupled to the temperature sensing circuitry 130 and the frequency detection circuitry 140. The comparator circuitry 135 receives the temperature voltage from the temperature sensing circuitry 130. The comparator circuitry 135 compares the temperature voltage to a reference voltage ($V_{TEMP\_REF}$). The reference voltage represents a threshold temperature of the device 105. The comparator circuitry 135 generates a temperature indication ($TEMP_{IND}$) responsive to the comparison of the temperature voltage to the reference voltage. In some examples, the temperature indication is a single bit value which represents a result of the comparison of the temperature voltage. In such examples, when the temperature voltage is greater than the reference voltage, the temperature indication is a first value (e.g., a logic one, a logic zero, a logical high, a logical low, etc.) and when the temperature voltage is less than the reference voltage, the temperature indication is a second value. Advantageously, the comparator circuitry 135 determines whether the temperature voltage represents a temperature greater than or less than a reference temperature represented by the reference voltage. The comparator circuitry 135 supplies the temperature indication to the frequency detection circuitry 140. An example implementation of the comparator circuitry 135 is illustrated in FIG. 2 and described further below.

The frequency detection circuitry 140 may be coupled to the HFOSC circuitry 110 and is coupled to the LFOSC circuitry 115, the comparator circuitry 135, and the PLL circuitry 145. The frequency detection circuitry 140 receives the first oscillator clock signal from the HFOSC circuitry 110, the second oscillator clock signal from the LFOSC circuitry 115, and the temperature indication from the comparator circuitry 135. The frequency detection circuitry 140 determines a fixed frequency ($FREF_{XTAL}$) of the first oscillator clock signal based on the second oscillator clock signal and the temperature indication. Advantageously, the first oscillator clock signal has a relatively high accuracy in comparison to the second oscillator clock signal.

In example operations, the frequency detection circuitry 140 determines a clock count value by counting a number of cycles of the first oscillator clock signal in one or more cycles of the second oscillator clock signal. In a first example, where the first oscillator clock signal is forty megahertz (40 MHz) and the second oscillator clock signal is thirty-two kilohertz (32 kHz), the frequency detection circuitry 140 may count five-thousand cycles of the first oscillator clock signal in four cycles of the second oscillator clock signal. In a second example, where the first oscillator clock signal is forty-eight megahertz (48 MHz) and the second oscillator clock signal is thirty-two kilohertz (32 kHz), the frequency detection circuitry 140 may count six-thousand cycles of the first oscillator clock signal in four cycles of the second oscillator clock signal. Advantageously, counting cycles of the first oscillator clock signal across a plurality of cycles of the second oscillator clock signal accounts for variations between cycles of the relatively less accurate low-speed second oscillator clock signal.

In such example operations, variations in temperature modify the resistance of the resistor 120, which modifies the frequency of the second oscillator clock signal. In the first example, where the first oscillator clock signal is forty megahertz (40 MHz) and the second oscillator clock signal is approximately thirty-two kilohertz (32 kHz), the frequency detection circuitry 140 may count anywhere between approximately forty-seven hundred cycles and sixty-one hundred cycles of the first oscillator clock signal in four cycles of the second oscillator clock signal. In such examples, the temperature of the device 105 modifies the frequency of the second oscillator clock signal responsive to the resistor 120. In the second example, where the first oscillator clock signal is forty-eight megahertz (48 MHz) and the second oscillator clock signal is approximately thirty-two kilohertz (32 kHz), the frequency detection circuitry 140 may count anywhere between approximately fifty-seven hundred cycles and seventy-three hundred cycles of the first oscillator clock signal in four cycles of the second oscillator clock signal. In such examples, the possible clock count values of cycles of the first oscillator clock signal in a number of cycles of the second oscillator clock signal form a range of possible clock count values.

The frequency detection circuitry 140 determines one or more possible frequencies of the first oscillator clock signal based on the determined clock count value. In some examples, the frequency detection circuitry 140 may determine a plurality of possible frequencies responsive to the determined clock count value being in a plurality of clock count ranges of possible clock count values. For example, the frequency detection circuitry 140 determines the frequency of the first oscillator clock signal is either forty or forty-eight megahertz responsive to a determined count of six-thousand cycles. In such an example, the determined count falls into the possible count values of both the forty and forty-eight megahertz clocks responsive to variations in the second oscillator clock signal.

The frequency detection circuitry 140 selects one of the possible frequencies of the first oscillator clock signal based on the temperature indication from the comparator circuitry 135. In some examples, the frequency detection circuitry 140 selects the higher frequency of the possible frequencies responsive to the temperature indication representing the temperature as less than the threshold temperature. In such examples, the frequency detection circuitry 140 selects the lower frequency of the possible frequencies responsive to the temperature indication representing the temperature as greater than the threshold temperature. For example, the frequency detection circuitry 140 selects the higher one of the possible frequencies as the frequency of the first oscillator clock signal responsive to a determination that the temperature of the system 100 is less than approximately twenty-five degrees Celsius. In such an example, the measured temperature is less than the threshold temperature of approximately twenty-five degrees Celsius. In another example, the frequency detection circuitry 140 selects the lower one of the possible frequencies as the frequency of the first oscillator clock signal responsive to a determination that the temperature of the system 100 is greater than approximately eighty-five degrees Celsius.

Advantageously, the frequency detection circuitry 140 selects one of the possible frequencies responsive to the temperature. The frequency detection circuitry 140 supplies the determined frequency to the PLL circuitry 145. The determined frequency represents the fixed rising edge frequency of the first oscillator clock signal. An example implementation of the frequency detection circuitry 140 is illustrated in FIG. 2 and described further below.

The PLL circuitry 145 may be coupled to the HFOSC circuitry 110 and is coupled to the frequency detection circuitry 140. The PLL circuitry 145 receives the first oscillator clock signal from the HFOSC circuitry 110 and the determined frequency from the frequency detection circuitry 140. The PLL circuitry 145 generates the reference clock signal and the system clock signal responsive to the first oscillator clock signal and the determined frequency. In some examples, the PLL circuitry 145 multiplies and/or divides the first oscillator clock signal by a reference number ($NUM_{REF}$) to generate one or both of the reference and system clock signals. The PLL circuitry 145 determines the reference number based on the determined frequency of the first oscillator clock signal and desired frequencies of the reference and system clock signals. For example, when the frequency detection circuitry 140 determines the first oscillator clock signal is a forty-megahertz (40 MHz) clock signal, the PLL circuitry 145 divides the first oscillator clock signal by five to generate an eight megahertz (8 MHz) clock signal as the reference clock signal. Alternatively, the PLL circuitry 145 may generate one or more clock signals using one or more reference numbers. The PLL circuitry 145 may supply the generated clock signals to one or more additional components of the device 105 (not illustrated for simplicity). Advantageously, accurately determining the frequency of the first oscillator clock signal reduces errors in the clock signals generated by the PLL circuitry 145.

FIG. 2 is a schematic diagram of an example of the comparator circuitry 135 of FIG. 1 and an example of the frequency detection circuitry 140 of FIG. 1. In the example of FIG. 2, the comparator circuitry 135 includes an example comparator 205 and an example reference voltage ($V_{TEMP\_REF}$) 210. In the example of FIG. 2, the frequency detection circuitry 140 includes first example counter circuitry 215, second example counter circuitry 220, example counter controller circuitry 225, an example datastore 230, a first example clock count range 235, a second example clock count range 240, a third example clock count range 245, example count comparison circuitry 250, and example count overlap determination circuitry 255.

FIG. 2 includes a block diagram of an example implementation of the comparator circuitry 135 and the frequency detection circuitry 140 to determine a frequency of the first oscillator clock signal from the HFOSC circuitry 110 of FIG. 1 based on temperature. The frequency detection circuitry 140 may be instantiated (e.g., creating an instance of, bring into being for any length of time, materialize, implement, etc.) by programmable circuitry such as a Central Processor Unit (CPU) executing first instructions. Additionally or alternatively, the comparator circuitry 135 and/or the frequency detection circuitry 140 may be instantiated (e.g., creating an instance of, bring into being for any length of time, materialize, implement, etc.) by (i) an Application Specific Integrated Circuit (ASIC) and/or (ii) a Field Programmable Gate Array (FPGA) structured and/or configured in response to execution of second instructions to perform operations corresponding to the first instructions. It should be understood that some or all of the circuitry of FIG. 2 may, thus, be instantiated at the same or different times. Some or all of the circuitry of FIG. 2 may be instantiated, for example, in one or more threads executing concurrently on hardware and/or in series on hardware. Moreover, in some examples, some or all of the circuitry of FIG. 2 may be implemented by microprocessor circuitry executing instructions and/or FPGA circuitry performing operations to implement one or more virtual machines and/or containers.

The comparator 205 has a first input that may be coupled to the temperature sensing circuitry 130 of FIG. 1 and a second input coupled to the reference voltage 210. The comparator 205 has an output coupled to the count overlap determination circuitry 255. The comparator 205 receives the temperature voltage from the temperature sensing circuitry 130 and the reference voltage 210. The reference voltage 210 represents a temperature voltage of the temperature sensing circuitry 130 at a reference temperature. In some examples, reference circuitry generates the reference voltage 210 without access to a clock signal from the PLL circuitry 145 of FIG. 1. For example, reference bandgap circuitry may be used to generate the reference voltage 210 without needing a reference clock. The comparator 205 generates the temperature indication ($TEMP_{IND}$) responsive to the comparison of the temperature voltage to the reference voltage 210.

In example operation, the comparator 205 sets the temperature indication to a first state (e.g., a logic one, logical high, etc.) responsive to the temperature voltage being less than the reference voltage 210. In such examples, the temperature of the device 105 is determined to be greater than a reference temperature of the reference voltage 210. In another example operation, the comparator 205 sets the temperature indication to a second state (e.g., a logic zero, logical low, etc.) responsive to the temperature voltage being greater than the reference voltage 210. In such examples, the temperature of the device 105 is determined to be less than the reference temperature of the reference voltage 210. Advantageously, the temperature indication identifies whether the temperature of the device 105 is greater than or less than a threshold temperature configurable by the reference voltage 210.

The first counter circuitry 215 has an input that may be coupled to the HFOSC circuitry 110 and an output coupled to the counter controller circuitry 225. The first counter circuitry 215 receives the first oscillator clock signal ($CLK_{XTAL}$) from the HFOSC circuitry 110. The first counter circuitry 215 generates a first oscillator clock count value ($COUNT_{XTAL}$) by counting a number of cycles of first oscillator clock signal. For example, the first counter circuitry 215 increments the first oscillator clock count responsive to a rising edge of the first oscillator clock signal. In some examples, the counter controller circuitry 225 controls the first counter circuitry 215. In such examples, the counter controller circuitry 225 may clear the first oscillator clock count value of the first counter circuitry 215 to start counting and read the first oscillator clock count value to stop counting. In other examples, the first counter circuitry 215 begins counting responsive to a detection of the first oscillator clock signal. The first counter circuitry 215 supplies the first oscillator clock count value to the counter controller circuitry 225. In some examples, the first counter circuitry 215 is instantiated by programmable circuitry executing first counter instructions and/or configured to perform operations such as those represented by the flowchart of FIG. 4.

The second counter circuitry 220 has an input that may be coupled to the LFOSC circuitry 115 of FIG. 1 and an output coupled to the counter controller circuitry 225. The second counter circuitry 220 receives the second oscillator clock signal (CLK$_{LFOSC}$) from the LFOSC circuitry 115. The second counter circuitry 220 generates a second oscillator clock count value (COUNT$_{LFOSC}$) by counting a number of cycles of second oscillator clock signal. For example, the second counter circuitry 220 increments the second oscillator clock count responsive to a rising edge of the second oscillator clock signal. In some examples, the counter controller circuitry 225 controls the second counter circuitry 220. In such examples, the counter controller circuitry 225 may clear the second oscillator clock count value of the second counter circuitry 220 to start counting and read the second oscillator clock count value to stop counting. In other examples, the second counter circuitry 220 begins counting responsive to the second oscillator clock signal. The second counter circuitry 220 supplies the second oscillator clock count value to the counter controller circuitry 225. In some examples, the second counter circuitry 220 is instantiated by programmable circuitry executing second counter instructions and/or configured to perform operations such as those represented by the flowchart of FIG. 4.

The counter controller circuitry 225 is coupled to the counter circuitry 215, 220 and the count comparison circuitry 250. The counter controller circuitry 225 receives the clock count values from the counter circuitry 215, 220. The counter controller circuitry 225 supplies the first oscillator clock count value to the count comparison circuitry 250 responsive to a comparison of the count values of the counter circuitry 215, 220. In some examples, the counter controller circuitry 225 supplies the first oscillator clock count value to the count comparison circuitry 250 responsive to the second oscillator clock count value being greater than or equal to a threshold count. For example, the counter controller circuitry 225 supplies the first oscillator clock count value responsive to the second counter circuitry 220 counting four cycles of the second oscillator clock signal. In such an example, the first oscillator clock count value represents a number of cycles of the first oscillator clock signal during four cycles of the second oscillator clock signal. In some examples, the counter circuitry 215, 220 stop counting cycles of the clock signals responsive to the counter controller circuitry 225 supplying the first oscillator clock count value to the count comparison circuitry 250. In some examples, the counter controller circuitry 225 is instantiated by programmable circuitry executing counter controller instructions and/or configured to perform operations such as those represented by the flowchart of FIG. 4.

The datastore 230 is coupled to the count comparison circuitry 250. In the example of FIG. 2, the datastore 230 stores the clock count ranges 235, 240, 245. Alternatively, the datastore 230 may include any plurality of clock count ranges. In some examples, the datastore 230 is a look up table (LUT). In other examples, the datastore 230 is a portion of memory address accessible memory.

The first clock count range 235 represents a range of possible counts of the first oscillator clock count value capable of representing a first frequency. In the example of FIG. 2, the first clock count range 235 has a minimum possible count value (MIN) and a maximum possible count value (MAX). The values between the minimum and maximum possible count values of the first clock count range 235 represent values of the first oscillator clock count value that may represent the first frequency depending on system variations such as variations in the frequency of the second oscillator clock signal. For example, the first clock count range 235 may identify counter values between a minimum value of approximately fifty-seven hundred and a maximum value of seventy-three hundred for forty-eight-megahertz (48 MHz) clock signals. In such an example, the first clock count range 235 may vary based on the frequency of the second oscillator clock signal, the tolerances of the second oscillator clock signal, and/or the number of cycles of second counter circuitry 220 before supplying the first oscillator clock count value to the count comparison circuitry 250.

The second clock count range 240 represents a range of possible counts of the first oscillator clock count value capable of representing a second frequency. In the example of FIG. 2, the second clock count range 240 has a minimum possible count value (MIN) and a maximum possible count value (MAX). The values between the minimum and maximum possible count values of the second clock count range 240 represent values of the first oscillator clock count value that may represent the second frequency. For example, the second clock count range 240 may identify counter values between approximately forty-seven hundred and sixty-one hundred as possible values for forty-megahertz (40 MHz) clock signals. In such an example, the second clock count range 240 may vary based on the frequency of the second oscillator clock signal, the tolerances of the second oscillator clock signal, and/or the number of cycles of second counter circuitry 220 before supplying the first oscillator clock count value to the count comparison circuitry 250 as a reference clock count value.

The third clock count range 245 represents a range of possible counts of the first oscillator clock count value capable of representing a third frequency. In the example of FIG. 2, the third clock count range 245 has a minimum possible count value (MIN) and a maximum possible count value (MAX). The values between the minimum and maximum possible count values of the third clock count range 245 represent values of the first oscillator clock count value that may represent the third frequency. For example, the third clock count range 245 may identify counter values between approximately thirty-one hundred and thirty-nine hundred as possible values for twenty-six-megahertz (26 MHz) clock signals. In such an example, the third clock count range 245 may vary based on the frequency of the second oscillator clock signal, the tolerances of the second oscillator clock signal, and/or the number of cycles of second counter circuitry 220 before supplying the first oscillator clock count value to the count comparison circuitry 250. In the example of FIG. 2, the datastore 230 includes the clock count ranges 235, 240, 245, which correspond in first, second, and third frequencies. Alternatively, the datastore 230 may include any number of clock count ranges corresponding to any number of frequencies.

The count comparison circuitry 250 is coupled to the counter controller circuitry 225, the datastore 230, and the count overlap determination circuitry 255. The count comparison circuitry 250 receives the reference clock count value from the counter controller circuitry 225. The count comparison circuitry 250 compares the reference clock count value to clock count ranges 235, 240, 245 of the datastore 230. The count comparison circuitry 250 supplies the frequencies of the one or more of the clock count ranges 235, 240, 245 including the reference clock count value. For example, the count comparison circuitry 250 determines the reference clock count value corresponds to the first and second frequencies of the clock count ranges 235, 240, 245 responsive to the reference clock count being between the minimum and maximum possible count values of the clock count ranges 235, 240. The count comparison circuitry 250 supplies the one or more determined frequencies to the count overlap determination circuitry 255. In some examples, the count comparison circuitry 250 is instantiated by programmable circuitry executing count comparison instructions and/or configured to perform operations such as those represented by the flowchart of FIG. 4.

The count overlap determination circuitry 255 is coupled to the comparator 205 and the counter controller circuitry 225. The count overlap determination circuitry 255 receives the temperature indication from the comparator 205 and the one or more determined frequencies from the count comparison circuitry 250. The count overlap determination circuitry 255 determines if there is more than one determined frequency from the count comparison circuitry 250. If the count overlap determination circuitry 255 determines there are more than one determined frequency, the count overlap determination circuitry 255 selects one of the determined frequencies based on the temperature indication. In some examples, when the temperature indication identifies the temperature of the device 105 to be greater than the reference temperature, the count overlap determination circuitry 255 selects the lesser of the determined frequencies. In such examples, when the temperature indication identifies the temperature of the device 105 to be less than the reference temperature, the count overlap determination circuitry 255 selects the greater of the determined frequencies.

In some example operations, the count overlap determination circuitry 255 may use a comparison of one or more reference temperatures to select one of the determined frequencies. For example, the count overlap determination circuitry 255 may determine temperatures less than twenty-five degrees Celsius to correspond to the higher of the determined frequencies, while temperature greater than eighty-five degrees Celsius correspond to the lower of the determined frequencies. In such examples, variations in the reference temperature account for variations in process and/or operating conditions. The count overlap determination circuitry 255 supplies the selected frequency to the PLL circuitry 145 of FIG. 1. In some examples, the count overlap determination circuitry 255 is instantiated by programmable circuitry executing count overlap determination instructions and/or configured to perform operations such as those represented by the flowchart of FIG. 4.

Figure 3:
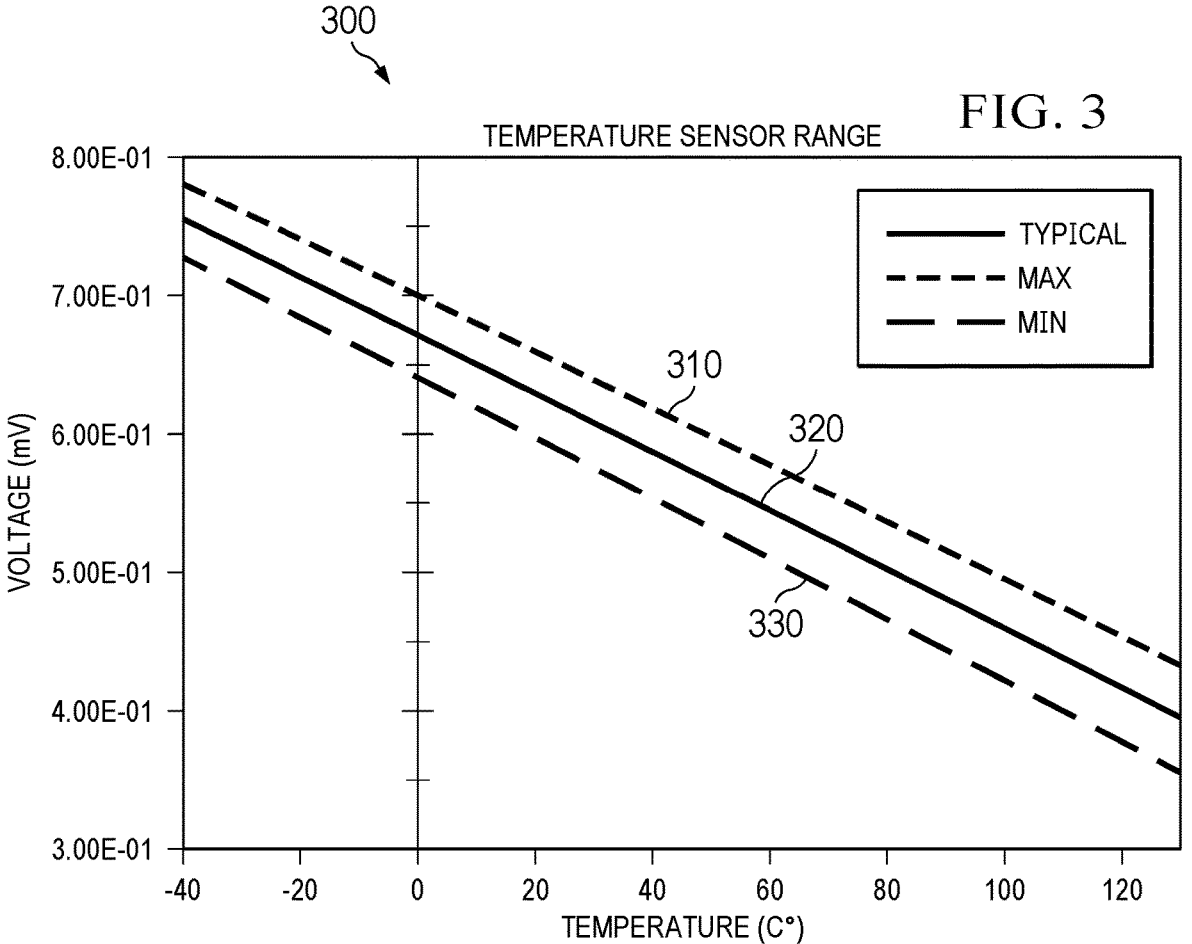
FIG. 3 is a plot of example voltages of the comparator circuitry of FIGS. 1 and 2 responsive to a range of temperatures.

FIG. 3 is a plot 300 of example temperature voltages across a range of possible temperatures. In the example of FIG. 3, the plot 300 includes an example maximum temperature voltage 310, an example typical temperature voltage 320, and an example minimum temperature voltage 330. The maximum temperature voltage 310 represents maximum voltages from the temperature sensing circuitry 130 of FIG. 1 for each temperature. The typical temperature voltage 320 represents expected voltages from the temperature sensing circuitry 130 for each temperature. The minimum temperature voltage 330 represents minimum voltages from the temperature sensing circuitry 130 for each temperature. In some examples, variations in voltages of the temperature sensing circuitry 130 are responsive to process variations, such as variations in the temperature sensing circuitry 130.

The temperature voltages 310, 320, 330 are approximately parallel. The temperature voltages 310, 320, 330 linearly decrease as the temperature increases. In an example operation of the temperature sensing circuitry 130 and the comparator circuitry 135 of FIGS. 1 and 2, the reference voltage 210 of FIG. 2 may represent a range of possible temperatures between the maximum temperature voltage 310 and the minimum temperature voltage 330. In such examples, designers may select the reference voltage 210 based on the range of possible temperatures. For example, when the reference voltage 210 is approximately five-hundred millivolts (500 mV), the comparator circuitry 135 may set the temperature indication responsive to a temperature between approximately sixty and one-hundred degrees Celsius.

Figure 4:
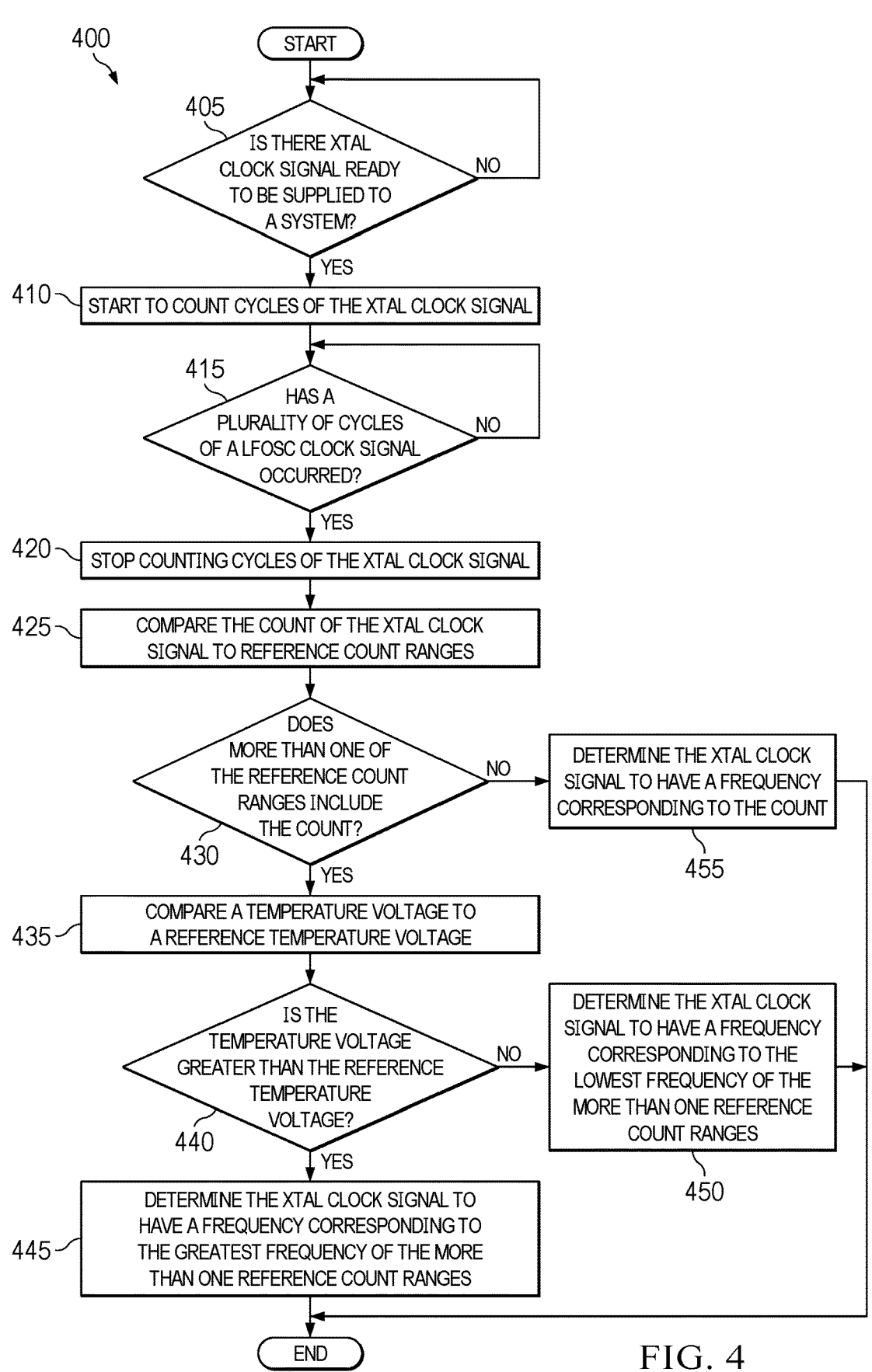
FIG. 4 is a flowchart representative of example operations and/or example machine-readable instructions that may be executed, instantiated, and/or performed to implement the frequency detection circuitry of FIG. 1.

FIG. 4 is a flowchart representative of example operations 400 that may be executed, instantiated, and/or performed to implement the frequency detection circuitry 140 of FIGS. 1 and 2. The example machine-readable instructions and/or the example operations 400 of FIG. 4 begin at Block 405, at which the first counter circuitry 215 of FIG. 2 determines if there is a first oscillator (XTAL) clock signal ready to be supplied to a system. (Block 405). In some examples, the first counter circuitry 215 determines if there is a relatively high-frequency first oscillator clock signal being supplied by the HFOSC circuitry 110 of FIG. 1. In such examples, the first counter circuitry 215 determines the first oscillator clock signal is ready to be supplied to the system 100 of FIG. 1 responsive to being coupled to the HFOSC circuitry 110. If the first counter circuitry 215 determines there is no XTAL clock signal ready to be supplied to the system 100 (e.g., Block 405 returns a result of NO), control proceeds to return to Block 405.

If the first counter circuitry 215 determines there is an XTAL clock signal ready to be supplied to the system 100 (e.g., Block 405 returns a result of YES), the first counter circuitry 215 starts to count cycles of the XTAL clock signal. (Block 410). In some examples, the first counter circuitry 215 begins to increment a first oscillator count value responsive to rising edges of the first oscillator clock signal from the HFOSC circuitry 110.

The counter controller circuitry 225 of FIG. 2 determines if a plurality of cycles of a second oscillator (LFOSC) clock signal have occurred. (Block 415). In some examples, the counter controller circuitry 225 allows the first counter circuitry 215 to continue to increment the first oscillator clock count value until a plurality of cycles of the second oscillator clock signal have occurred. In such examples, the counter controller circuitry 225 may wait for the second oscillator clock count value to be greater than or equal to a threshold count value. For example, the counter controller circuitry 225 allows the first counter circuitry 215 to continue to count until the second counter circuitry 220 has a second oscillator clock count value of four. In such examples, the first oscillator clock count value represents four cycles of the second oscillator clock signal from the LFOSC circuitry 115. If the counter controller circuitry 225 determines a plurality of cycles of the LFOSC clock signal have not occurred (e.g., Block 415 returns a result of NO), control proceeds to return to Block 415.

If the counter controller circuitry 225 determines that a plurality of cycles of the LFOSC clock signal have occurred (e.g., Block 415 returns a result of YES), the first counter circuitry 215 stops counting cycles of the XTAL clock signal. (Block 420). In some examples, the first counter circuitry 215 stops counting cycles of the first oscillator clock signal responsive to the counter controller circuitry 225 supplying a reference count value to the count comparison circuitry 250 of FIG. 2. The reference count value is the value of the first oscillator clock count value after the plurality of cycles of the second oscillator clock signal have occurred.

The count comparison circuitry 250 compares the count of the XTAL clock signal to reference count ranges. (Block 425). In some examples, the count comparison circuitry 250 compares the reference count value from the counter controller circuitry 225 to reference count ranges defined by the clock count ranges 235, 240, 245 of FIG. 2. In such examples, the count comparison circuitry 250 determines one or more possible frequencies of the first oscillator clock signal based on the reference count range being in one or more of the clock count ranges 235, 240, 245. The count comparison circuitry 250 supplies the one or more possible frequencies to the count overlap determination circuitry 255 of FIG. 2.

The count overlap determination circuitry 255 determines if more than one of the reference count ranges include the count. (Block 430). In some examples, the count overlap determination circuitry 255 receives one or more possible frequencies of the first oscillator clock signal based on the clock count ranges 235, 240, 245. In such examples, the one or more possible frequencies corresponding to one or more of the clock count ranges 235, 240, 245.

If the count overlap determination circuitry 255 determines that more than one of the reference count ranges include the count (e.g., Block 430 returns a result of YES), the comparator 205 of FIG. 2 compares a temperature voltage to a reference voltage. (Block 435). In some examples, the temperature sensing circuitry 130 of FIG. 1 generates the temperature voltage based on a temperature of the system 100. In such examples, the comparator 205 compares the temperature voltage to the reference voltage 210 of FIG. 2. The reference voltage 210 represents a threshold temperature of the comparator circuitry 135.

The comparator 205 determines if the temperature voltage is greater than (or in some examples, lesser than) the reference temperature voltage. (Block 440). In some examples, the comparator 205 generates the temperature indication based on the comparison of the temperature voltage to the reference voltage 210. In such examples, the comparator 205 sets the temperature indication to a first value responsive to the temperature voltage being greater than the reference voltage 210 and a second value responsive to the temperature voltage being less than the reference voltage 210.

If the comparator 205 determines the temperature voltage is greater than the reference temperature voltage (e.g., Block 440 returns a result of YES), the count overlap determination circuitry 255 determines the XTAL clock signal to have a frequency corresponding to the greatest frequency of the more than one reference count ranges. (Block 445). In some examples, the count overlap determination circuitry 255 receives the temperature indication from the comparator circuitry 135. In such examples, when the temperature indication represents the temperature voltage being greater than the reference temperature voltage, the count overlap determination circuitry 255 determines the largest frequency of the possible frequencies to be the frequency of the first oscillator clock signal. The count overlap determination circuitry 255 supplies the determined frequency to the PLL circuitry 145 of FIG. 1. Control proceeds to End.

If the comparator 205 determines the temperature voltage is not greater than the reference temperature voltage (e.g., Block 440 returns a result of NO), the count overlap determination circuitry 255 determines the XTAL clock signal to have a frequency corresponding to the lowest frequency of the more than one reference count ranges. (Block 450). In some examples, when the temperature indication represents the temperature voltage is not greater than the reference temperature voltage, the count overlap determination circuitry 255 determines the lowest frequency of the possible frequencies to be the frequency of the first oscillator clock signal. The count overlap determination circuitry 255 supplies the determined frequency to the PLL circuitry 145. Control proceeds to End.

If the count overlap determination circuitry 255 determines that there is only one of the reference count ranges include the count (e.g., Block 430 returns a result of NO), the comparator 205 determines the XTAL clock signal to have a frequency corresponding to the count. (Block 455). In some examples, the count overlap determination circuitry 255 determines the possible frequency to be the frequency of the first oscillator clock signal. The count overlap determination circuitry 255 supplies the determined frequency to the PLL circuitry 255 supplies the determined frequency to the PLL circuitry 145. Control proceeds to End.

Although example methods are described with reference to the flowchart illustrated in FIG. 4, many other methods of implementing the frequency detection circuitry 140 of FIGS. 1 and 2 may alternatively be used in accordance with this description. For example, the order of execution of the blocks may be changed, and/or some of the blocks described may be changed, eliminated, or combined. Similarly, additional operations may be included in the manufacturing process before, in between, or after the blocks shown in the illustrated examples.

While an example manner of implementing the comparator circuitry 135 of FIGS. 1 and 2 and the frequency detection circuitry 140 of FIGS. 1 and 2 is illustrated in FIG. 2, one or more of the elements, processes, and/or devices illustrated in FIG. 2 may be combined, divided, re-arranged, omitted, eliminated, and/or implemented in any other way. Further, the counter circuitry 215, 220, the counter controller circuitry 225, the count comparison circuitry 250, the count overlap determination circuitry 255, and/or, more generally, the example the frequency detection circuitry 140, may be implemented by hardware alone or by hardware in combination with software and/or firmware. Thus, for example, any of the counter circuitry 215, 220, the counter controller circuitry 225, the count comparison circuitry 250, the count overlap determination circuitry 255, and/or, more generally, the example the frequency detection circuitry 140, could be implemented by programmable circuitry in combination with machine-readable instructions (e.g., firmware or software), processor circuitry, analog circuit(s), digital circuit (s), logic circuit(s), programmable processor(s), programmable microcontroller(s), graphics processing unit(s) (GPU (s)), digital signal processor(s) (DSP(s)), ASIC(s), programmable logic device(s) (PLD(s)), and/or field programmable logic device(s) (FPLD(s)) such as FPGAs. Further still, the example the frequency detection circuitry 140 of FIG. 2 may include one or more elements, processes, and/or devices in addition to, or instead of, those illustrated in FIG. 2, and/or may include more than one of any or all of the illustrated elements, processes and devices.

Flowchart(s) representative of example machine-readable instructions, which may be executed by programmable circuitry to implement and/or instantiate the frequency detection circuitry 140 of FIG. 2 and/or representative of example operations which may be performed by programmable circuitry to implement and/or instantiate the frequency detection circuitry 140 of FIG. 2, are shown in FIG. 4. The machine-readable instructions may be one or more executable programs or portion(s) of one or more executable programs for execution by programmable circuitry such as the programmable circuitry 512 shown in the example processor platform 500 described below in connection with FIG. 5 and/or may be one or more function(s) or portion(s) of functions to be performed by the example programmable circuitry (e.g., an FPGA) described below in connection with FIGS. 6 and/or 7. In some examples, the machine-readable instructions cause an operation, a task, etc., to be carried out and/or performed in an automated manner in the real world. As used herein, "automated" means without human involvement.

The program may be embodied in instructions (e.g., software and/or firmware) stored on one or more non-transitory computer readable and/or machine-readable storage medium such as cache memory, a magnetic-storage device or disk (e.g., a floppy disk, a Hard Disk Drive (HDD), etc.), an optical-storage device or disk (e.g., a Blu-ray disk, a Compact Disk (CD), a Digital Versatile Disk (DVD), etc.), a Redundant Array of Independent Disks (RAID), a register, ROM, a solid-state drive (SSD), SSD memory, non-volatile memory (e.g., electrically erasable programmable read-only memory (EEPROM), flash memory, etc.), volatile memory (e.g., Random Access Memory (RAM) of any type, etc.), and/or any other storage device or storage disk. The instructions of the non-transitory computer readable and/or machine-readable medium may program and/or be executed by programmable circuitry located in one or more hardware devices, but the entire program and/or parts thereof could alternatively be executed and/or instantiated by one or more hardware devices other than the programmable circuitry and/or embodied in dedicated hardware. The machine-readable instructions may be distributed across multiple hardware devices and/or executed by two or more hardware devices (e.g., a server and a client hardware device). For example, the client hardware device may be implemented by an endpoint client hardware device (e.g., a hardware device associated with a human and/or machine user) or an intermediate client hardware device gateway (e.g., a radio access network (RAN)) that may facilitate communication between a server and an endpoint client hardware device. Similarly, the non-transitory computer readable storage medium may include one or more mediums. Further, although the example program is described with reference to the flowchart illustrated in FIG. 4, many other methods of implementing the example frequency detection circuitry 140 may alternatively be used. For example, the order of execution of the blocks of the flowchart(s) may be changed, and/or some of the blocks described may be changed, eliminated, or combined. Additionally or alternatively, any or all of the blocks of the flow chart may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The programmable circuitry may be distributed in different network locations and/or local to one or more hardware devices (e.g., a single-core processor (e.g., a single core CPU), a multi-core processor (e.g., a multi-core CPU, an XPU, etc.)). For example, the programmable circuitry may be a CPU and/or an FPGA located in the same package (e.g., the same integrated circuit (IC) package or in two or more separate housings), one or more processors in a single machine, multiple processors distributed across multiple servers of a server rack, multiple processors distributed across one or more server racks, etc., and/or any combination(s) thereof.

The machine-readable instructions described herein may be stored in one or more of a compressed format, an encrypted format, a fragmented format, a compiled format, an executable format, a packaged format, etc. Machine readable instructions as described herein may be stored as data (e.g., computer-readable data, machine-readable data, one or more bits (e.g., one or more computer-readable bits, one or more machine-readable bits, etc.), a bitstream (e.g., a computer-readable bitstream, a machine-readable bitstream, etc.), etc.) or a data structure (e.g., as portion(s) of instructions, code, representations of code, etc.) that may be utilized to create, manufacture, and/or produce machine executable instructions. For example, the machine-readable instructions may be fragmented and stored on one or more storage devices, disks and/or computing devices (e.g., servers) located at the same or different locations of a network or collection of networks (e.g., in the cloud, in edge devices, etc.). The machine-readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine-readable instructions may be stored in multiple parts, which are individually compressed, encrypted, and/or stored on separate computing devices, wherein the parts when decrypted, decompressed, and/or combined form a set of computer-executable and/or machine executable instructions that implement one or more functions and/or operations that may together form a program such as that described herein.

In another example, the machine-readable instructions may be stored in a state in which they may be read by programmable circuitry, but require addition of a library (e.g., a dynamic link library (DLL)), a software development kit (SDK), an application programming interface (API), etc., in order to execute the machine-readable instructions on a particular computing device or other device. In another example, the machine-readable instructions may need to be configured (e.g., settings stored, data input, network addresses recorded, etc.) before the machine-readable instructions and/or the corresponding program(s) can be executed in whole or in part. Thus, machine-readable, computer readable and/or machine-readable media, as used herein, may include instructions and/or program(s) regardless of the particular format or state of the machine-readable instructions and/or program(s).

The machine-readable instructions described herein can be represented by any past, present, or future instruction language, scripting language, programming language, etc. For example, the machine-readable instructions may be represented using any of the following languages: C, C++, Java, C#, Perl, Python, JavaScript, HyperText Markup Language (HTML), Structured Query Language (SQL), Swift, etc.

As mentioned above, the example operations of FIG. 4 may be implemented using executable instructions (e.g., computer readable and/or machine-readable instructions) stored on one or more non-transitory computer readable and/or machine-readable media. As used herein, the terms non-transitory computer readable medium, non-transitory computer readable storage medium, non-transitory machine-readable medium, and/or non-transitory machine-readable storage medium are expressly defined to include any type of computer readable storage device and/or storage disk and to exclude propagating signals and to exclude transmission media. Examples of such non-transitory computer readable medium, non-transitory computer readable storage medium, non-transitory machine-readable medium, and/or non-transitory machine-readable storage medium include optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms "non-transitory computer readable storage device" and "non-transitory machine-readable storage device" are defined to include any physical (mechanical, magnetic and/or electrical) hardware to retain information for a time period, but to exclude propagating signals and to exclude transmission media. Examples of non-transitory computer readable storage devices and/or non-transitory machine-readable storage devices include random access memory of any type, read only memory of any type, solid state memory, flash memory, optical discs, magnetic disks, disk drives, and/or redundant array of independent disks (RAID) systems. As used herein, the term "device" refers to physical structure such as mechanical and/or electrical equipment, hardware, and/or circuitry that may or may not be configured by computer readable instructions, machine-readable instructions, etc., and/or manufactured to execute computer-readable instructions, machine-readable instructions, etc.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements, or actions may be implemented by, e.g., the same entity or object. Additionally, although individual features may be included in different examples or claims, these may possibly be combined, and the inclusion in different examples or claims does not imply that a combination of features is not feasible and/or advantageous.

Figure 5:
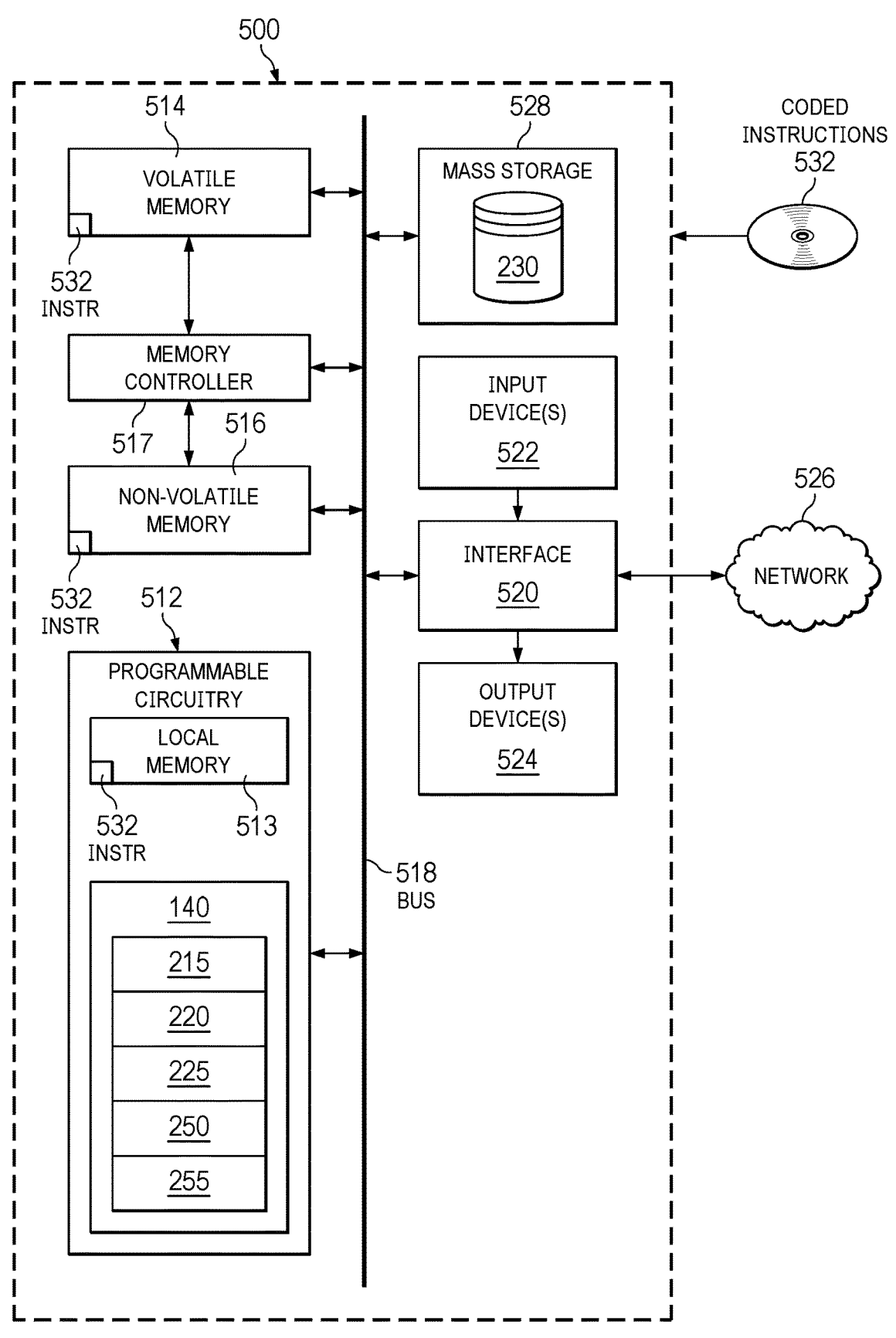
FIG. 5 is a block diagram of an example processing platform including programmable circuitry structured to execute, instantiate, and/or perform the example machine-readable instructions and/or perform the example operations of FIG. 4 to implement the comparator circuitry of FIG. 2 and the frequency detection circuitry of FIG. 2.

FIG. 5 is a block diagram of an example programmable circuitry platform 500 structured to execute and/or instantiate the example machine-readable instructions and/or the example operations of FIG. 4 to implement the frequency detection circuitry 140 of FIG. 2. The programmable circuitry platform 500 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing and/or electronic device.

The programmable circuitry platform 500 of the illustrated example includes programmable circuitry 512. The programmable circuitry 512 of the illustrated example is hardware. For example, the programmable circuitry 512 can be implemented by one or more integrated circuits, logic circuits, FPGAs, microprocessors, CPUs, GPUs, DSPs, and/or microcontrollers from any desired family or manufacturer. The programmable circuitry 512 may be implemented by one or more semiconductor based (e.g., silicon based) devices. In this example, the programmable circuitry 512 implements the counter circuitry 215, 220 of FIG. 2, the counter controller circuitry 225 of FIG. 2, the count comparison circuitry 250 of FIG. 2, the count overlap determination circuitry 255 of FIG. 2, and/or, more generally, the example the frequency detection circuitry 140 of FIGS. 1 and 2.

The programmable circuitry 512 of the illustrated example includes a local memory 513 (e.g., a cache, registers, etc.). The programmable circuitry 512 of the illustrated example is in communication with main memory 514, 516, which includes a volatile memory 514 and a non-volatile memory 516, by a bus 518. The volatile memory 514 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 516 may be implemented by flash memory and/or any other desired type of memory device. Access to the main memory 514, 516 of the illustrated example is controlled by a memory controller 517. In some examples, the memory controller 517 may be implemented by one or more integrated circuits, logic circuits, microcontrollers from any desired family or manufacturer, or any other type of circuitry to manage the flow of data going to and from the main memory 514, 516.

The programmable circuitry platform 500 of the illustrated example also includes interface circuitry 520. The interface circuitry 520 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 522 are connected to the interface circuitry 520. The input device(s) 522 permit(s) a user (e.g., a human user, a machine user, etc.) to enter data and/or commands into the programmable circuitry 512. The input device(s) 522 can be implemented by, for example, an audio sensor, a microphone, a camera (still or video), a keyboard, a button, a mouse, a touchscreen, a trackpad, a trackball, an isopoint device, and/or a voice recognition system.

One or more output devices 524 are also connected to the interface circuitry 520 of the illustrated example. The output device(s) 524 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 520 of the illustrated example, thus, typically includes a graphics driver card, a graphics driver chip, and/or graphics processor circuitry such as a GPU.

The interface circuitry 520 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 526. The communication can be by, for example, an Ethernet connection, a digital subscriber line (DSL) connection, a telephone line connection, a coaxial cable system, a satellite system, a beyond-line-of-sight wireless system, a line-of-sight wireless system, a cellular telephone system, an optical connection, etc.

The programmable circuitry platform 500 of the illustrated example also includes one or more mass storage discs or devices 528 to store firmware, software, and/or data. Examples of such mass storage discs or devices 528 include magnetic storage devices (e.g., floppy disk, drives, HDDs, etc.), optical storage devices (e.g., Blu-ray disks, CDs, DVDs, etc.), RAID systems, and/or solid-state storage discs or devices such as flash memory devices and/or SSDs. Additionally, mass storage discs or devices 528 may include and/or store data of the datastore 230 of FIG. 2.

The machine-readable instructions 532, which may be implemented by the machine-readable instructions of FIG. 4, may be stored in the mass storage device 528, in the volatile memory 514, in the non-volatile memory 516, and/or on at least one non-transitory computer readable storage medium such as a CD or DVD which may be removable.

Figure 6:
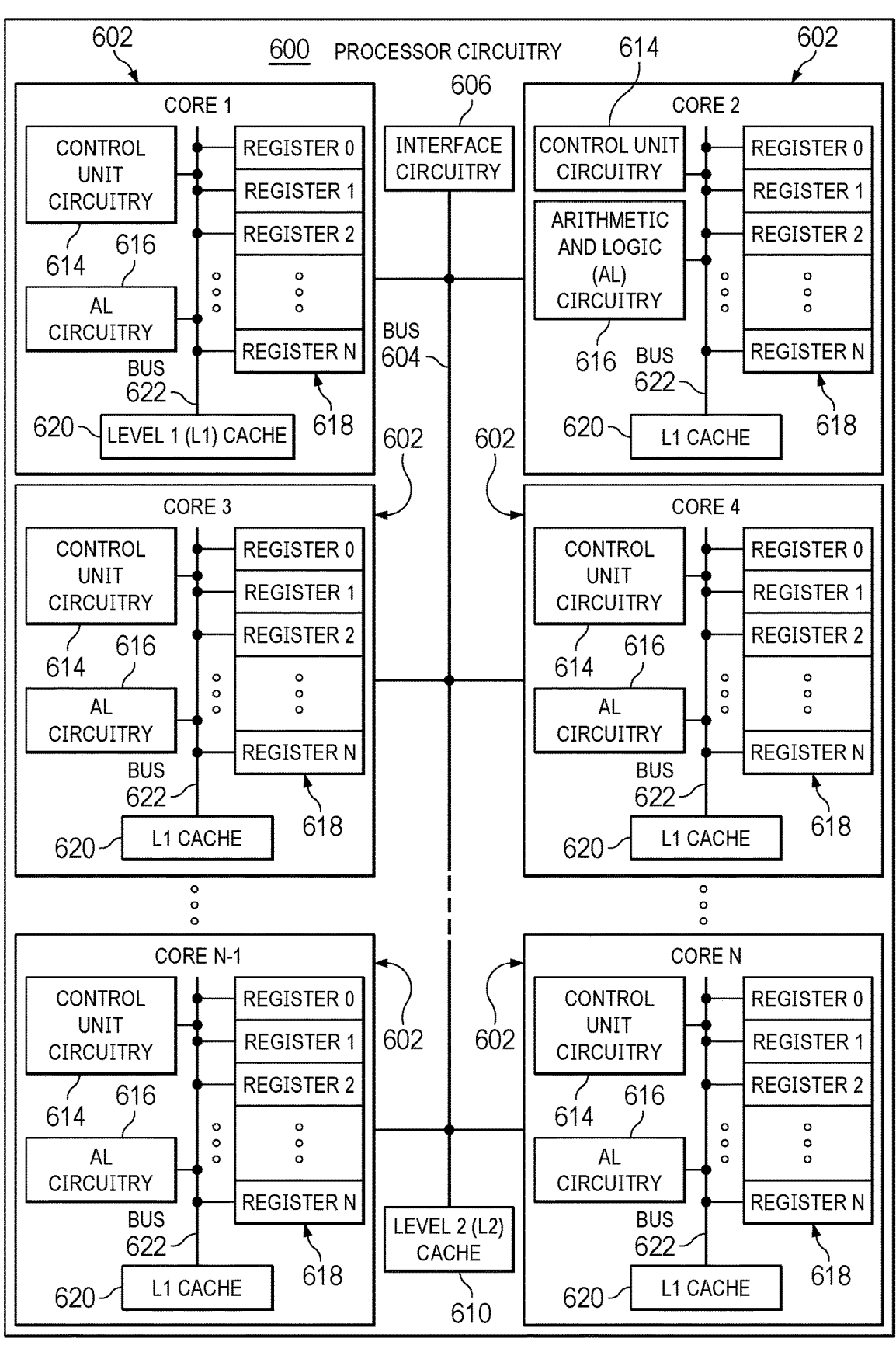
FIG. 6 is a block diagram of an example implementation of the programmable circuitry of FIG. 5.

FIG. 6 is a block diagram of an example implementation of the programmable circuitry 512 of FIG. 5. In this example, the programmable circuitry 512 of FIG. 5 is implemented by a microprocessor 600. For example, the microprocessor 600 may be a general-purpose microprocessor (e.g., general-purpose microprocessor circuitry). The microprocessor 600 executes some or all of the machine-readable instructions of the flowcharts of FIG. 4 to effectively instantiate the circuitry of FIG. 2 as logic circuits to perform operations corresponding to those machine-readable instructions. In some such examples, the circuitry of FIG. 2 is instantiated by the hardware circuits of the microprocessor 600 in combination with the machine-readable instructions. For example, the microprocessor 600 may be implemented by multi-core hardware circuitry such as a CPU, a DSP, a GPU, an XPU, etc. Although it may include any number of example cores 602 (e.g., 1 core), the microprocessor 600 of this example is a multi-core semiconductor device including N cores. The cores 602 of the microprocessor 600 may operate independently or may cooperate to execute machine-readable instructions. For example, machine code corresponding to a firmware program, an embedded software program, or a software program may be executed by one of the cores 602 or may be executed by multiple ones of the cores 602 at the same or different times.

In some examples, the machine code corresponding to the firmware program, the embedded software program, or the software program is split into threads and executed in parallel by two or more of the cores 602. The software program may correspond to a portion or all of the machine-readable instructions and/or operations represented by the flowchart of FIG. 4.

The cores 602 may communicate by a first example bus 604. In some examples, the first bus 604 may be implemented by a communication bus to effectuate communication associated with one(s) of the cores 602. For example, the first bus 604 may be implemented by at least one of an Inter-Integrated Circuit (I2C) bus, a Serial Peripheral Interface (SPI) bus, a PCI bus, or a PCIe bus. Additionally or alternatively, the first bus 604 may be implemented by any other type of computing or electrical bus. The cores 602 may obtain data, instructions, and/or signals from one or more external devices by example interface circuitry 606. The cores 602 may output data, instructions, and/or signals to the one or more external devices by the interface circuitry 606. Although the cores 602 of this example include example local memory 620 (e.g., Level 1 (L1) cache that may be split into an L1 data cache and an L1 instruction cache), the microprocessor 600 also includes example shared memory 610 that may be shared by the cores (e.g., Level 2 (L2 cache)) for high-speed access to data and/or instructions. Data and/or instructions may be transferred (e.g., shared) by writing to and/or reading from the shared memory 610. The local memory 620 of each of the cores 602 and the shared memory 610 may be part of a hierarchy of storage devices including multiple levels of cache memory and the main memory (e.g., the main memory 514, 516 of FIG. 5). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 602 may be referred to as a CPU, DSP, GPU, etc., or any other type of hardware circuitry. Each core 602 includes control unit circuitry 614, arithmetic and logic (AL) circuitry (sometimes referred to as an ALU) 616, a plurality of registers 618, the local memory 620, and a second example bus 622. Other structures may be present. For example, each core 602 may include vector unit circuitry, single instruction multiple data (SIMD) unit circuitry, load/store unit (LSU) circuitry, branch/jump unit circuitry, floating-point unit (FPU) circuitry, etc. The control unit circuitry 614 includes semiconductor-based circuits structured to control (e.g., coordinate) data movement within the corresponding core 602. The AL circuitry 616 includes semiconductor-based circuits structured to perform one or more mathematic and/or logic operations on the data within the corresponding core 602. The AL circuitry 616 of some examples performs integer based operations. In other examples, the AL circuitry 616 also performs floating-point operations. In yet other examples, the AL circuitry 616 may include first AL circuitry that performs integer-based operations and second AL circuitry that performs floating-point operations. In some examples, the AL circuitry 616 may be referred to as an Arithmetic Logic Unit (ALU).

The registers 618 are semiconductor-based structures to store data and/or instructions such as results of one or more of the operations performed by the AL circuitry 616 of the corresponding core 602. For example, the registers 618 may include vector register(s), SIMD register(s), general-purpose register(s), flag register(s), segment register(s), machine-specific register(s), instruction pointer register(s), control register(s), debug register(s), memory management register (s), machine check register(s), etc. The registers 618 may be arranged in a bank as shown in FIG. 6. Alternatively, the registers 618 may be organized in any other arrangement, format, or structure, such as by being distributed throughout the core 602 to shorten access time. The second bus 622 may be implemented by at least one of an I2C bus, a SPI bus, a PCI bus, or a PCIe bus.

Each core 602 and/or, more generally, the microprocessor 600 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 600 is a semiconductor device fabricated to include many transistors interconnected to implement the structures described above in one or more integrated circuits (ICs) contained in one or more packages.

The microprocessor 600 may include and/or cooperate with one or more accelerators (e.g., acceleration circuitry, hardware accelerators, etc.). In some examples, accelerators are implemented by logic circuitry to perform certain tasks more quickly and/or efficiently than can be done by a general-purpose processor. Examples of accelerators include ASICs and FPGAs such as those described herein. A GPU, DSP and/or other programmable device can also be an accelerator. Accelerators may be on-board the microprocessor 600, in the same chip package as the microprocessor 600 and/or in one or more separate packages from the microprocessor 600.

Figure 7:
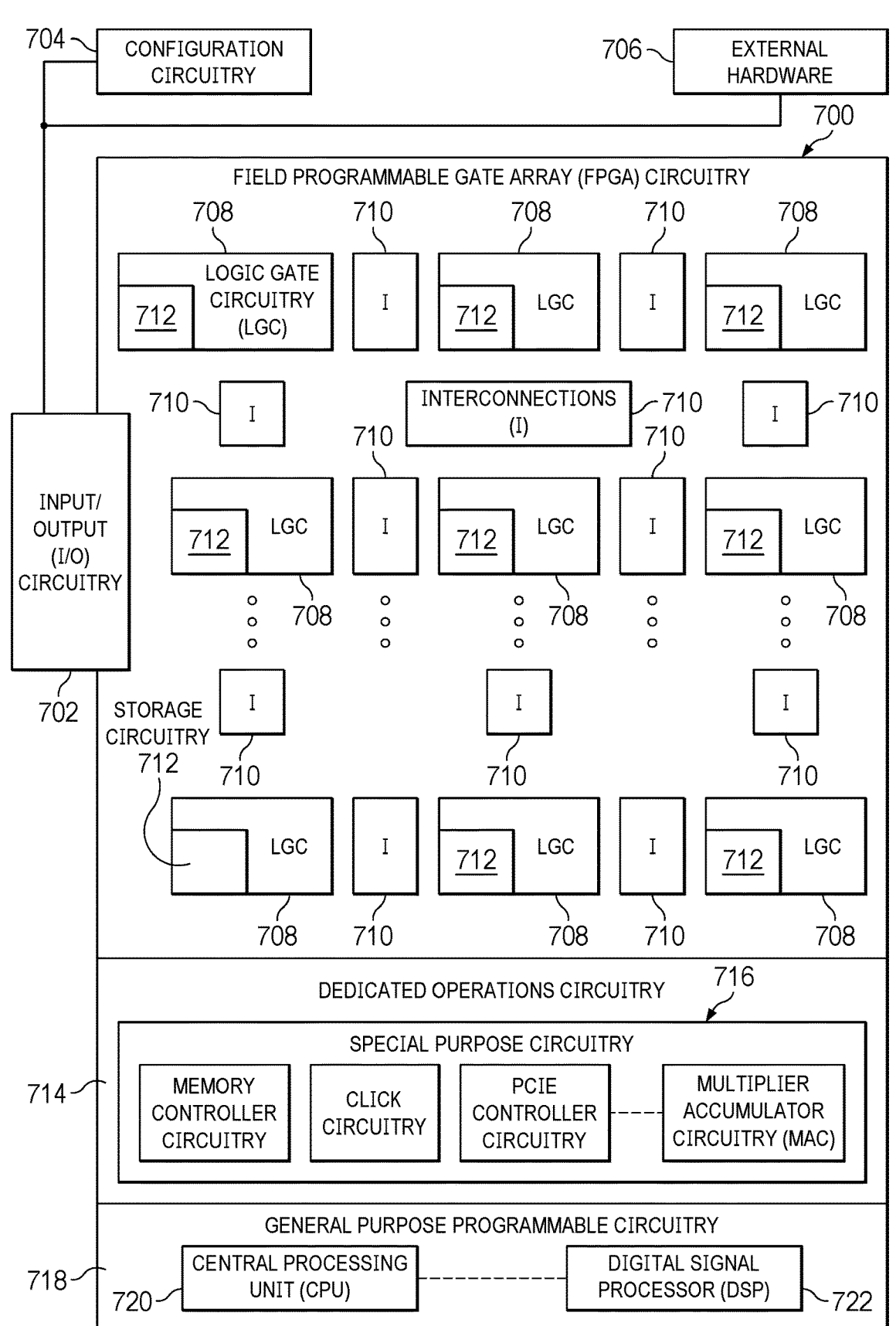
FIG. 7 is a block diagram of another example implementation of the programmable circuitry of FIG. 5.

FIG. 7 is a block diagram of another example implementation of the programmable circuitry 512 of FIG. 5. In this example, the programmable circuitry 512 is implemented by FPGA circuitry 700. For example, the FPGA circuitry 700 may be implemented by an FPGA. The FPGA circuitry 700 can be used, for example, to perform operations that could otherwise be performed by the example microprocessor 600 of FIG. 6 executing corresponding machine-readable instructions. However, once configured, the FPGA circuitry 700 instantiates the operations and/or functions corresponding to the machine-readable instructions in hardware and, thus, can often execute the operations/functions faster than they could be performed by a general-purpose microprocessor executing the corresponding software.

More specifically, in contrast to the microprocessor 600 of FIG. 6 described above (which is a general purpose device that may be programmed to execute some or all of the machine-readable instructions represented by the flowchart of FIG. 4 but whose interconnections and logic circuitry are fixed once fabricated), the FPGA circuitry 700 of the example of FIG. 7 includes interconnections and logic circuitry that may be configured, structured, programmed, and/or interconnected in different ways after fabrication to instantiate, for example, some or all of the operations/functions corresponding to the machine-readable instructions represented by the flowchart of FIG. 4. In particular, the FPGA circuitry 700 may be thought of as an array of logic gates, interconnections, and switches. The switches can be programmed to change how the logic gates are interconnected by the interconnections, effectively forming one or more dedicated logic circuits (unless and until the FPGA circuitry 700 is reprogrammed). The configured logic circuits enable the logic gates to cooperate in different ways to perform different operations on data received by input circuitry. Those operations may correspond to some or all of the instructions (e.g., the software and/or firmware) represented by the flowchart of FIG. 4. As such, the FPGA circuitry 700 may be configured and/or structured to effectively instantiate some or all of the operations/functions corresponding to the machine-readable instructions of the flowchart(s) of FIG. 4 as dedicated logic circuits to perform the operations/functions corresponding to those software instructions in a dedicated manner analogous to an ASIC. Therefore, the FPGA circuitry 700 may perform the operations/functions corresponding to the some or all of the machine-readable instructions of FIG. 4 faster than the general-purpose microprocessor can execute the same.

In the example of FIG. 7, the FPGA circuitry 700 is configured and/or structured in response to being programmed (and/or reprogrammed one or more times) based on a binary file. In some examples, the binary file may be compiled and/or generated based on instructions in a hardware description language (HDL) such as Lucid, Very High Speed Integrated Circuits (VHSIC) Hardware Description Language (VHDL), or Verilog. For example, a user (e.g., a human user, a machine user, etc.) may write code or a program corresponding to one or more operations/functions in an HDL; the code/program may be translated into a low-level language as needed; and the code/program (e.g., the code/program in the low-level language) may be converted (e.g., by a compiler, a software application, etc.) into the binary file. In some examples, the FPGA circuitry 700 of FIG. 7 may access and/or load the binary file to cause the FPGA circuitry 700 of FIG. 7 to be configured and/or structured to perform the one or more operations/functions. For example, the binary file may be implemented by a bit stream (e.g., one or more computer-readable bits, one or more machine-readable bits, etc.), data (e.g., computer-readable data, machine-readable data, etc.), and/or machine-readable instructions accessible to the FPGA circuitry 700 of FIG. 7 to cause configuration and/or structuring of the FPGA circuitry 700 of FIG. 7, or portion(s) thereof.

In some examples, the binary file is compiled, generated, transformed, and/or otherwise output from a uniform software platform utilized to program FPGAs. For example, the uniform software platform may translate first instructions (e.g., code or a program) that correspond to one or more operations/functions in a high-level language (e.g., C, C++, Python, etc.) into second instructions that correspond to the one or more operations/functions in an HDL. In some such examples, the binary file is compiled, generated, and/or otherwise output from the uniform software platform based on the second instructions. In some examples, the FPGA circuitry 700 of FIG. 7 may access and/or load the binary file to cause the FPGA circuitry 700 of FIG. 7 to be configured and/or structured to perform the one or more operations/functions. For example, the binary file may be implemented by a bit stream (e.g., one or more computer-readable bits, one or more machine-readable bits, etc.), data (e.g., computer-readable data, machine-readable data, etc.), and/or machine-readable instructions accessible to the FPGA circuitry 700 of FIG. 7 to cause configuration and/or structuring of the FPGA circuitry 700 of FIG. 7, or portion(s) thereof.

The FPGA circuitry 700 of FIG. 7, includes example input/output (I/O) circuitry 702 to obtain and/or output data to/from example configuration circuitry 704 and/or external hardware 706. For example, the configuration circuitry 704 may be implemented by interface circuitry that may obtain a binary file, which may be implemented by a bit stream, data, and/or machine-readable instructions, to configure the FPGA circuitry 700, or portion(s) thereof. In some such examples, the configuration circuitry 704 may obtain the binary file from a user, a machine (e.g., hardware circuitry (e.g., programmable or dedicated circuitry) that may implement an Artificial Intelligence/Machine Learning (AI/ML) model to generate the binary file), etc., and/or any combination(s) thereof). In some examples, the external hardware 706 may be implemented by external hardware circuitry. For example, the external hardware 706 may be implemented by the microprocessor 600 of FIG. 6.

The FPGA circuitry 700 also includes an array of example logic gate circuitry 708, a plurality of example configurable interconnections 710, and example storage circuitry 712. The logic gate circuitry 708 and the configurable interconnections 710 are configurable to instantiate one or more operations/functions that may correspond to at least some of the machine-readable instructions of FIG. 4 and/or other desired operations. The logic gate circuitry 708 shown in FIG. 7 is fabricated in blocks or groups. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 708 to enable configuration of the electrical structures and/or the logic gates to form circuits to perform desired operations/functions. The logic gate circuitry 708 may include other electrical structures such as look-up tables (LUTs), registers (e.g., flip-flops or latches), multiplexers, etc.

The configurable interconnections 710 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 708 to program desired logic circuits.

The storage circuitry 712 of the illustrated example is structured to store result(s) of the one or more of the operations performed by corresponding logic gates. The storage circuitry 712 may be implemented by registers or the like. In the illustrated example, the storage circuitry 712 is distributed amongst the logic gate circuitry 708 to facilitate access and increase execution speed.

The example FPGA circuitry 700 of FIG. 7 also includes example dedicated operations circuitry 714. In this example, the dedicated operations circuitry 714 includes special purpose circuitry 716 that may be invoked to implement commonly used functions to avoid the need to program those functions in the field. Examples of such special purpose circuitry 716 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 700 may also include example general purpose programmable circuitry 718 such as an example CPU 720 and/or an example DSP 722. Other general purpose programmable circuitry 718 may additionally or alternatively be present such as a GPU, an XPU, etc., that can be programmed to perform other operations.

Although FIGS. 6 and 7 illustrate two example implementations of the programmable circuitry 512 of FIG. 5, many other approaches are contemplated. For example, FPGA circuitry may include an on-board CPU, such as one or more of the example CPU 720 of FIG. 6. Therefore, the programmable circuitry 512 of FIG. 5 may additionally be implemented by combining at least the example microprocessor 600 of FIG. 6 and the example FPGA circuitry 700 of FIG. 7. In some such hybrid examples, one or more cores 602 of FIG. 6 may execute a first portion of the machine-readable instructions represented by the flowchart of FIG. 4 to perform first operation(s)/function(s), the FPGA circuitry 700 of FIG. 7 may be configured and/or structured to perform second operation(s)/function(s) corresponding to a second portion of the machine-readable instructions represented by the flowchart of FIG. 4, and/or an ASIC may be configured and/or structured to perform third operation(s)/function(s) corresponding to a third portion of the machine-readable instructions represented by the flowchart of FIG. 4.

It should be understood that some or all of the circuitry of FIG. 2 may, thus, be instantiated at the same or different times. For example, same and/or different portion(s) of the microprocessor 600 of FIG. 6 may be programmed to execute portion(s) of machine-readable instructions at the same and/or different times. In some examples, same and/or different portion(s) of the FPGA circuitry 700 of FIG. 7 may be configured and/or structured to perform operations/functions corresponding to portion(s) of machine-readable instructions at the same and/or different times.

In some examples, some or all of the circuitry of FIG. 2 may be instantiated, for example, in one or more threads executing concurrently and/or in series. For example, the microprocessor 600 of FIG. 6 may execute machine-readable instructions in one or more threads executing concurrently and/or in series. In some examples, the FPGA circuitry 700 of FIG. 7 may be configured and/or structured to carry out operations/functions concurrently and/or in series. Moreover, in some examples, some or all of the circuitry of FIG. 2 may be implemented within one or more virtual machines and/or containers executing on the microprocessor 600 of FIG. 6.

In some examples, the programmable circuitry 512 of FIG. 5 may be in one or more packages. For example, the microprocessor 600 of FIG. 6 and/or the FPGA circuitry 700 of FIG. 7 may be in one or more packages. In some examples, an XPU may be implemented by the programmable circuitry 512 of FIG. 5, which may be in one or more packages. For example, the XPU may include a CPU (e.g., the microprocessor 600 of FIG. 6, the CPU 720 of FIG. 7, etc.) in one package, a DSP (e.g., the DSP 722 of FIG. 7) in another package, a GPU in yet another package, and an FPGA (e.g., the FPGA circuitry 700 of FIG. 7) in still yet another package.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Numerical identifiers such as "first," "second," "third," etc. are used merely to distinguish between elements of substantially the same type in terms of structure and/or function. These identifiers as used in the detailed description do not necessarily align with those used in the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially"

preceding a value means +/−10 percent of the stated value, or, if the value is zero, a reasonable range of values around zero.

Modifications are possible in the described embodiments, and other embodiments are possible, within the scope of the claims.

What is claimed is:

1. An apparatus comprising:
comparator circuitry configurable to compare a first voltage to a second voltage, wherein the first voltage represents a temperature, and the second voltage represents a reference temperature;
a first clock circuit configurable to produce a first clock signal;
a second clock circuit configurable to produce a second clock signal;
counter circuitry configurable to determine a clock count value based on the first clock signal and the second clock signal;
comparison circuitry configurable to determine a set of frequencies associated with the first clock signal based the clock count value; and
overlap determination circuitry configurable to select a frequency of the set of frequencies based on the comparator circuitry.

2. The apparatus of claim 1, further comprising temperature sensing circuitry configurable to determine the first voltage as a voltage characteristic of a thermal bipolar junction transistor, the first voltage represents a temperature of the apparatus.

3. The apparatus of claim 1, wherein the counter circuitry is configurable to generate the clock count value by counting cycles of the first clock signal for a number of cycles of the second clock signal.

4. The apparatus of claim 1, wherein the set of frequencies are of a plurality of possible frequencies each defined by a clock count range, the clock count range specifies a minimum possible count, a maximum possible count, and a frequency of the clock count range, the minimum possible count represents a minimum value of the clock count value that corresponds to the frequency, the maximum possible count represents a maximum value of the clock count value that corresponds to the frequency, the set of frequencies having overlapping clock count ranges.

5. The apparatus of claim 1, wherein the overlap determination circuitry is further configurable to determine the selected frequency responsive to the comparison of the first voltage to the second voltage.

6. The apparatus of claim 1, further comprising the first clock circuit, wherein the first clock circuit includes external crystal (XTAL) oscillator circuitry coupled to the counter circuitry, the XTAL oscillator circuitry configurable to generate the first clock signal of a frequency greater than the second clock signal.

7. A device comprising:
comparison circuitry configurable to determine frequencies based on clock count ranges and a clock count value, the clock count ranges each having a range of count values corresponding to respective frequencies, the frequencies corresponding to the clock count ranges that include the clock count value;
comparator circuitry configurable to generate a temperature indication based on a comparison of a temperature voltage to a reference voltage; and
overlap determination circuitry configurable to select a frequency of the frequencies based on the temperature indication.

8. The device of claim 7, further comprising temperature sensing circuitry configurable to determine the temperature voltage as a voltage characteristic of a thermal bipolar junction transistor, the temperature voltage represents a temperature of the device.

9. The device of claim 7, further comprising low frequency oscillator (LFOSC) circuitry configurable to generate a clock signal using an NWELL resistor and a capacitor.

10. The device of claim 9, wherein the clock signal of the LFOSC circuitry is a first clock signal, the device further comprising counter circuitry configurable to determine the clock count value, the clock count value represents a count of a number of cycles of a second clock signal in a plurality of cycles of the first clock signal.

11. The device of claim 7, wherein the frequencies are of a plurality of possible frequencies each defined by one of the clock count ranges, each of the clock count ranges including data to determine a minimum count, a maximum count, and a frequency of a clock count range, the minimum count represents a minimum value of the clock count value that corresponds to the frequency, the maximum count represents a maximum value of the clock count value that corresponds to the frequency.

12. The device of claim 7, wherein the overlap determination circuitry is further configurable to determine the selected frequency to be a frequency of an oscillator clock signal responsive to the temperature indication of the comparator circuitry.

13. The device of claim 7, further comprising external crystal (XTAL) oscillator circuitry configurable to generate a first clock signal of a frequency greater than a second clock signal from low frequency oscillator (LFOSC) circuitry.

14. A method comprising:
counting a number of cycles of a first clock signal for a number of cycles of a second clock signal;

comparing the number of cycles of the first clock signal to a plurality of clock count ranges;
determining a set of frequencies of the clock count ranges that includes the number of cycles of the first clock signal; and
selecting a first frequency of the set of frequencies based on a temperature of a device.

15. The method of claim 14, wherein the first clock signal is from external crystal (XTAL) oscillator circuitry and the second clock signal is from low frequency oscillator (LFOSC) circuitry, a frequency of the first clock signal is greater than a frequency of the second clock signal.

16. The method of claim 14, further comprising comparing a temperature voltage to a reference temperature voltage to select the first frequency, the temperature voltage represents the temperature of the device and the reference temperature voltage represents a reference temperature.

17. The method of claim 14, further comprising generating a temperature voltage using temperature dependent characteristics of a bipolar junction transistor, the temperature voltage representing a temperature of a device.

18. The method of claim 14, further comprising:
generating a first voltage that represents the temperature of the device; and
comparing the first voltage to a second voltage to determine whether the temperature of the device is greater than or less than a threshold temperature of the second voltage.

19. The method of claim 14, further comprising determining the first clock signal has a frequency of forty-eight megahertz (MHz) or forty megahertz based on the temperature of the device.

* * * * *